(12) United States Patent
Van Aert et al.

(10) Patent No.: US 8,383,321 B2
(45) Date of Patent: Feb. 26, 2013

(54) METHOD FOR DEVELOPING A PRINTING PLATE PRECURSOR

(75) Inventors: Hubertus Van Aert, Pulderbos (BE); Pascal Meeus, Turnhout (BE); Stefaan Lingier, Assenede (BE)

(73) Assignee: Agfa Graphics, N.V., Mortsel (BE)

( * ) Notice: Subject to any disclaimer, the term of this patent is extended or adjusted under 35 U.S.C. 154(b) by 383 days.

(21) Appl. No.: 12/670,806

(22) PCT Filed: Aug. 19, 2008

(86) PCT No.: PCT/EP2008/060850
§ 371 (c)(1),
(2), (4) Date: Jan. 26, 2010

(87) PCT Pub. No.: WO2009/027272
PCT Pub. Date: Mar. 5, 2009

(65) Prior Publication Data
US 2010/0203458 A1      Aug. 12, 2010

Related U.S. Application Data

(60) Provisional application No. 60/968,367, filed on Aug. 28, 2007.

(30) Foreign Application Priority Data

Aug. 27, 2007   (EP) ..................................... 07115039

(51) Int. Cl.
*G03F 7/26* (2006.01)
*G03F 7/32* (2006.01)
*B41N 1/08* (2006.01)
(52) U.S. Cl. ...... 430/302; 430/435; 101/453; 101/463.1
(58) Field of Classification Search .................. 430/302, 430/434, 435; 101/453, 463.1
See application file for complete search history.

(56) References Cited

U.S. PATENT DOCUMENTS

| | | | | |
|---|---|---|---|---|
| 5,002,857 A | * | 3/1991 | Toyama et al. | 430/300 |
| 6,171,761 B1 | | 1/2001 | Minamide et al. | |
| 6,649,319 B2 | * | 11/2003 | Fiebag et al. | 430/165 |
| 2004/0067432 A1 | * | 4/2004 | Kitson et al. | 430/160 |
| 2005/0266349 A1 | * | 12/2005 | Van Damme et al. | 430/300 |

FOREIGN PATENT DOCUMENTS

| | | |
|---|---|---|
| EP | 1 457 837 A2 | 9/2004 |
| EP | 1 536 285 A2 | 6/2005 |
| EP | 1 614 540 A1 | 1/2006 |
| EP | 1 703 014 A1 | 9/2006 |
| EP | 1 722 274 A1 | 11/2006 |
| WO | WO 2005/016645 A1 | 2/2005 |

OTHER PUBLICATIONS

EP Search Report for EP 07 11 5039 (Apr. 7, 2008).
International Search Report for PCT/EP2008/60850 (Nov. 6, 2008).

* cited by examiner

*Primary Examiner* — Anca Eoff
(74) *Attorney, Agent, or Firm* — Leydig, Voit & Mayer, Ltd.

(57) ABSTRACT

A method for developing a printing plate precursor comprising the step of immersing the precursor in an aqueous alkaline developing solution comprising a (co)polymer comprising a monomeric unit which is represented by the following formula (I): wherein L is a linking group; $R^1$, $R^2$ and $R^3$ independently represent hydrogen or an alkyl group; $R^4$ represents an optionally substituted hydroxyaryl group; x=0 or 1; y=0 or 1 and when y=0 then x=1 and L is further bound to C* to form a cyclic structure.

(I)

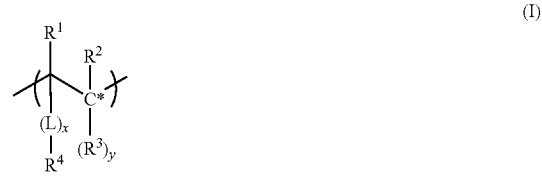

27 Claims, No Drawings

METHOD FOR DEVELOPING A PRINTING PLATE PRECURSOR

FIELD OF THE INVENTION

The present invention relates to a method for developing a lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by crosslinking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-625,728.

Negative working plate precursors which do not require a pre-heat step may contain an image-recording layer that works by heat-induced particle coalescence of a thermoplastic polymer particle (latex), as described in e.g. EP-As 770 494, 770 495, 770 496 and 770 497. These patents disclose a method for making a lithographic printing plate comprising the steps of (1) image-wise exposing an imaging element comprising hydrophobic thermoplastic polymer particles dispersed in a hydrophilic binder and a compound capable of converting light into heat, (2) and developing the image-wise exposed element by applying fountain and/or ink.

Some of these thermal processes enable platemaking without wet processing and are for example based on ablation of one or more layers of the coating. At the exposed areas the surface of an underlying layer is revealed which has a different affinity towards ink or fountain than the surface of the unexposed coating.

Other thermal processes which enable platemaking without wet processing are for example processes based on a heat-induced hydrophilic/oleophilic conversion of one or more layers of the coating so that at exposed areas a different affinity towards ink or fountain is created than at the surface of the unexposed coating.

U.S. Pat. No. 5,030,550 discloses a developer for positive photoresists which contains a basic compound and a specific non-ionic surfactant comprising an oxyethylene and an oxypropylene group. For accelerating the dissolution of the photoresist compositions in a developer, polyhydroxy compounds such as novolac may be added to the developer.

JP 3062034 discloses a developer for positive photoresists which contains an organomettalic surfactant and an alkali soluble resin such as novolac.

US 2005/0175942 discloses a developer for printing plates comprising a polyoxyalkylene adduct of alkylene diamine, a polyoxyalkylene compound having an acid radical and an anionic surfactant.

A major problem associated with positive-working printing plate precursors based on a solubility difference is the low differentiation between the development kinetics of exposed and non-exposed areas—i.e. the dissolution of the exposed areas in the developer is not completely finished before the unexposed areas also start dissolving in the developer. This often results in insufficient clean-out which may become apparent as a reduction of the sensitivity of the plate. Reduced clean-out usually results in toning (ink-acceptance in the non-image areas) of the printing plate and/or in ink build-up on the blanket. The low differentiation between the development kinetics of exposed and non-exposed areas may further lead to a loss of coating in the image areas, especially a loss of small image details or so-called high lights; a reduced press life and/or a reduced chemical resistance. Basically, a too small difference in dissolving rate in the developer between the exposed and the unexposed areas results in virtually no processing latitude. In order to increase this difference in dissolving rate, a so-called image dissolution inhibiting agent, which is capable of preventing etching of the image-areas during developing, is often added to the developer solution. However, such compounds may interact with the image forming material which dissolves from the non-image areas into the developer during processing possibly resulting in insoluble matter in the processing bath, also referred to as sludge. This development sludge can be deposited on the printing plate which impairs the images formed thereon and/or can precipitate in the processing bath making the maintenance of the processing bath more burdensome. Furthermore, as such interactions consume the image dissolution inhibiting agent, the activity of the development solution changes within time. Indeed, it is often observed that during consecutive development steps, the development solution becomes more aggressive resulting in a higher solid/imaging material loss and/or a higher loss of fine image details. This phenomenon is known in the art as aggressiveness increase of the developer.

SUMMARY OF THE INVENTION

It is an object of the present invention to provide an improved method for developing a heat-sensitive lithographic printing plate precursor.

This object is realized by a method for developing a printing plate precursor comprising the step of immersing the precursor in an aqueous alkaline developing solution comprising a (co)polymer comprising a monomeric unit which is represented by the following formula I:

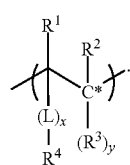

(I)

wherein
L is a linking group;
$R^1$, $R^2$ and $R^3$ independently represent hydrogen or an alkyl group;
$R^4$ represents an optionally substituted hydroxyaryl group;
x=0 or 1;
y=0 or 1 and when y=0 then x=1 and L is further bound to C* to form a cyclic structure.

It was surprisingly found that the addition of a (co)polymer comprising a monomeric unit which is represented by the above formula (I) to a developing solution provides a constant and/or stable developing activity to said solution; even when the developing solution contains a image dissolution inhibiting agent.

Other features, elements, steps, characteristics and advantages of the present invention will become more apparent from the following detailed description of preferred embodiments of the present invention.

DETAILED DESCRIPTION OF THE INVENTION

The aqueous, alkaline developer solution used in the present invention, which will simply be referred to hereinafter as the developing solution, comprises a (co)polymer including a monomeric unit which contains a hydroxyaryl group and which is represented by the following formula (I):

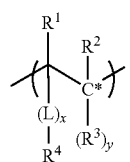

(I)

wherein
L is a linking group;
$R^1$, $R^2$ and $R^3$ independently represent hydrogen or a straight, branched or cyclic alkyl group such as methyl, ethyl, propyl, isopropyl, butyl, tertiary butyl, pentyl, cyclopentyl, cyclohexyl;
$R^4$ represents an optionally substituted hydroxyaryl group;
x=0 or 1;
y=0 or 1 and when y=0 then x=1 and L is further bound to C* to form a cyclic structure.

With a hydroxyaryl group is meant an aryl group comprising at least one hydroxyl group. An aryl group is an aromatic hydrocarbon such as a phenyl group, a benzyl group, a tolyl group, an ortho- meta- or para-xylyl group, naphtalenic group, an anthracenic group or a phenanthrenic group.

The optional substituents present on the hydroxyaryl group are selected from hydrogen, a hydroxyl group, a halogen such as Cl and Br, an optionally substituted alkyl group such as a methyl group, an ethyl group, a propyl group, an isopropyl group, a butyl group or a tertiary butyl group, an alkenyl group, an alkynyl group, a cycloalkyl group such as a cyclopentyl group, a cyclohexyl group, a 1,3-dimethylcyclohexyl group, an optionally substituted aryl group, an optionally substituted heteroaryl group, an optionally substituted aralkyl group, an optionally substituted heteroaralkyl group, $-SO_2-NH-R^5$, $-NH-SO_2-R^6$, $-CO-NR^5-R^7$, $-NR^5-CO-R^6$, $-O-CO-R^6$, $-CO-O-R^5$, $-CO-R^5$, $-SO_3-R^5$, $-SO_2-R^5$, $-SO-R^6$, $-P(=O)(-O-R^5)(-O-R^7)$, $-NR^5-R^7$, $-O-R^5$, $-S-R^5$, $-CN$, $-NO_2$, and/or an ester or a salt thereof, and/or any combination and wherein $R^5$, $R^6$ and $R^7$ are independently selected from hydrogen or an optionally substituted alkyl group, alkenyl group, alkynyl group, cycloalkyl group, heterocyclic group, aryl group, heteroaryl group, aralkyl or heteroaralkyl group and/or an ester or a salt thereof, and/or any combination.

The optional substituents present on the aryl, heteroaryl, aralkyl or heteroaralkyl group are preferably represented by similar groups as described in the former paragraph.

The linking group L represents an optionally substituted alkylene, optionally substituted arylene, is optionally substituted heteroarylene, $-O-$, $-CO-$, $-CO-O-$, $-O-CO-$, $-CS-$, $-O-(CH_2)_k-$, $-(CH_2)_k-O-$, $-(CH_2)_k-O-CO-$, $-O-CO-(CH_2)_k-$, $-(CH_2)_k-O-CO-(CH_2)_l-$, $-(CH_2)_k-COO-$, $-CO-O-(CH_2)_k-$, $-(CH_2)_k-COO-(CH_2)_l-$, $-(CH_2)_k-NH-$, $-NH-(CH_2)_k-$, $-(CH_2)_k-CONH-$, $-CH_2)_k-CONH-SO_2-$, $-NH-(CH_2)_k-O-(CH_2)_l-$, $-CO-(CH_2)_k-$, $-(CH_2)_k-CO-$, $-CO-NH-$, $-NH-CO-$, $-NH-CO-O-$, $-O-CO-NH$, $-(CH_2)_k-CO-NH-$, $-NH-CO-(CH_2)_k-$, $-NH-CO-NH-$, $-NH-CS-NH-$, $-SO-$, $-SO_2-$, $-CH=N-$, $-NH-NH-$, $-(CH_2)_k-NHCO-$, or combinations thereof; and wherein k and l independently represent 0 or an integer equal to or greater than 1, and the substituents optionally present on the alkylene, the arylene or the heteroarylene group may be represented by an alkyl group, a halogen such as a chlorine or bromine atom, a hydroxyl group, an amino group, (di)alkylamino group, an alkoxy group, a phosphonic acid group or a salt thereof.

In a preferred embodiment, the developing solution comprises a (co)polymer containing the monomeric unit represented by formula (II):

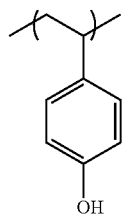

(III)

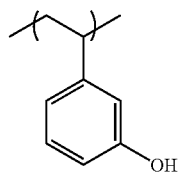

(IV)

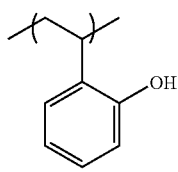
(V)

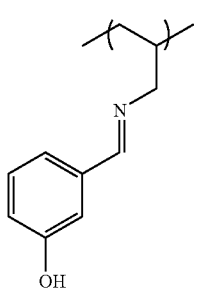
(VI)

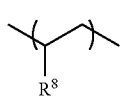
(II)

wherein $R^8$ is an optionally substituted hydroxyaryl group. The optional substituents present on the hydroxyaryl group are selected from hydrogen, a hydroxyl group, a halogen such as Cl and Br, an optionally substituted alkyl group such as methyl, ethyl, propyl, isopropyl, butyl, tertiary butyl, etc., an alkenyl group, an alkynyl group, a cycloalkyl group such as cyclopentyl group, cyclohexyl group, 1,3-dimethylcyclohexyl group, an optionally substituted aryl group, an optionally substituted heteroaryl group, an optionally substituted aralkyl, an optionally substituted heteroaralkyl group, —$SO_2$—NH—$R^5$, —NH—$SO_2$—$R^6$, —CO—$NR^5$—$R^7$, —$NR^5$—CO—$R^6$, —O—CO—$R^6$, —CO—O—$R^5$, —CO—$R^5$, —$SO_3$—$R^5$, —$SO_2$—$R^5$, —$SO_2R^6$, —P(=O)(—O—$R^5$)(—O—$R^7$), —$NR^5$—$R^7$, —O—$R^5$, —S—$R^5$, —CN, —$NO_2$, and/or an ester or a salt thereof, and/or any combination and wherein $R^5$, $R^6$ and $R^7$ are independently selected from hydrogen or an optionally substituted alkyl, alkenyl, alkynyl, cycloalkyl, heterocyclic, aryl, heteroaryl, aralkyl or heteroaralkyl group and/or an ester or a salt thereof, and/or any combination.

The optional substituents present on the aryl, heteroaryl, aralkyl or heteraralkyl group are preferably represented by similar groups as described in the former paragraph.

In a preferred embodiment, the developing solution comprises a (co)polymer containing a monomeric unit represented by the formula's (III) to (XV):

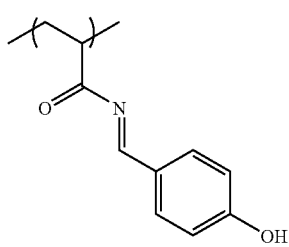
(VII)

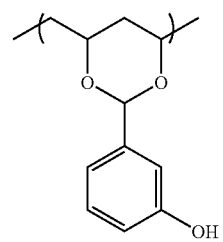
(VIII)

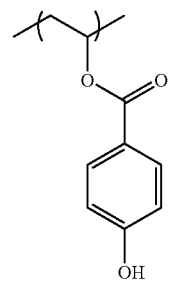
(IX)

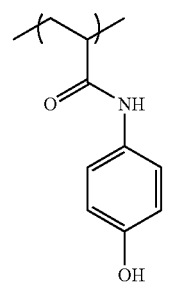
(X)

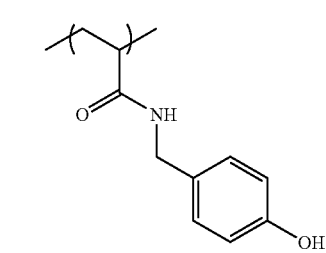
(XI)

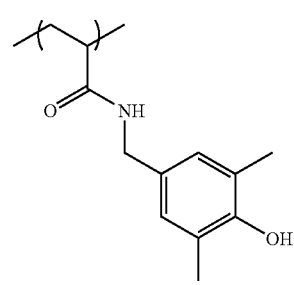
(XII)

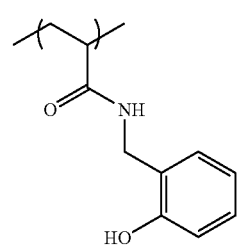
(XIII)

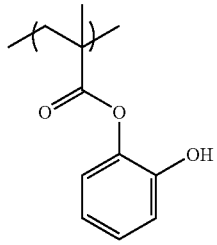

(XIV)

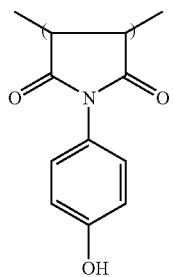

(XV)

The (co)polymer may be a homopolymer including a monomeric unit represented by one of the formula's (I) to (XV); or the (co)polymer may be a copolymer containing 40% wt, more preferably at least 50% wt, most preferably at least 55% wt of one or more of the monomeric units represented by the formula's (I) to (XV).

In the embodiment wherein the (co)polymer is a copolymer, it may further comprise, besides one or more of the monomeric units represented by the formula's (I) to (XV), monomeric units derived from the monomers selected from alkylene oxides such as ethylene oxide, glycidol and propylene oxide; vinyl alcohol; acrylic acid; methacrylic acid; alkylacrylates such as butylacrylate, 2-ethylhexylacrylate and cyclohexyl acrylate; alkyl methacrylates such as methyl methacrylate, butyl methacrylate, benzyl methacrylate, lauryl methacrylate and stearyl methacrylate; allyl methacrylate; fluorinated alkylacrylates such as trifluoroethylacrylate and pentafluoropropylacrylate; hydroxyalkyl methacrylate such as hydroxyethyl methacrylate; hydroxyalkyl acrylate such as hydroxyethyl acrylate; maleic acid; itaconic acid; crotonic acid; fumaric acid; vinylpyrrolidone; acrylamides such as hydroxyethyl acrylamide; methacrylamides such as hydroxypropyl methacrylamide; vinyl acetate; vinyl methyl ether; vinyl sulfonate; vinylphosphonic acid; styrene sulfonic acid; sulphoethyl methacrylate; 2-acrylamido-2-methyl-1-propanesulfonic acid; or protonated or alkylated derivates of vinylpyridine, vinylimidazole or N-vinyl diethylamine; siloxanes such as dimethylsiloxane, diphenylsiloxane and methylphenyl siloxane; perfluoroalkylethylene; ethylene; isoprene; butadiene; chlorinated or brominated monomers such is as vinyl chloride or vinylidene chloride; vinyl esters such as vinyl propionate and vinyl stearate; vinyl ethers such as vinyl propylether; styrene; styrene derivatives; acrylonitrile; methacrylonitrile; N-alkylacrylamides and N-alkylmethacrylamides.

In a preferred embodiment, the developing solution comprises a copolymer including one or more of the monomeric units represented by the formula's (I) to (VX) and at least one monomeric unit derived from the monomers selected from acrylic acid, methacrylic acid, alkylacrylate, alkyl methacrylate, allyl methacrylate, hydroxyalkyl methacrylate and hydroxyalkyl acrylate.

In a highly preferred embodiment, the (co)polymer is a copolymer of hydroxystyrene and styrene, a copolymer of hydroxystyrene and alkyl(meth)acrylate or a copolymer of hydroxystyrene and hydroxyalkyl(meth)acrylate. The amount of hydroxystyrene in the hydroxystyrene/styrene copolymer is preferably at least 60% wt, more preferably at least 70% wt and most preferably at least 80% wt. The amount of hydroxystyrene in the hydroxystyrene/alkyl(meth)acrylate or in the hydroxystyrene/hydroxyalkyl(meth)acrylate copolymer is preferably at least 45% wt, more preferably at least 50% wt and most preferably at least 55% wt.

The average molecular weight Mw of the (co)polymer may range from 500 to 100,000 g/mol, preferably from 1000 to 80,000 g/mol, more preferably 1500 to 50,000 g/mol and most preferably from 2000 to 30,000 g/mol.

The amount of (co)polymer in the developing solution is preferably ranging between 0.05% wt and 5% wt, more preferably between 0.1% wt and 3% wt and most preferably between 0.15% wt and 1% wt.

The developing solution is an aqueous alkaline developer solution with preferably a pH of at least 10, more preferably at least 11 and most preferably at least 12.

The developing solution preferably contains a image dissolution inhibiting agent. Image dissolution inhibiting agents are typically non-ionic, cationic or amphoteric compounds. Suitable examples of image dissolution inhibiting agents include:

(1) Polyglycols having the following structure:

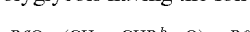

wherein $R^a$ represents hydrogen, an optionally substituted alkyl group having 1 to 30 carbon atoms, or more preferably 2 to 20 carbon atoms, —$COR^t$, an optionally substituted aryl group or an optionally substituted aralkyl group;

$R^b$ represents hydrogen, methyl, ethyl and/or mixtures thereof;

$R^c$ represents hydrogen, an alkyl group, —$COR^d$, —$NR^d R^e$, —$CH_2COOH$ or —$CH_2COO^-M^+$; and wherein $M^+$ represents $NH_4^+$, $Na^+$ or $K^+$ and $R^t$, $R^d$ and $R^e$ independently represent hydrogen, an optionally substituted alkyl group having 1 to 30 carbon atoms, or more preferably 2 to 20 carbon atoms, an optionally substituted alkenyl group, an optionally substituted aryl group or an optionally substituted aralkyl group.

The optional substituents on the alkyl, aryl or aralkyl group may be selected from an alkyl group having upto 30 carbon atoms, or more preferably 2 to 20 carbon atoms, a hydroxide group or a halogen such as Cl or Br.

Block copolymers including blocks comprising polyglycols with different chemical structures (as discussed above) are image dissolution inhibiting agents of special interest. Such blockcopolymers can for example be obtained via ringopening polymerisation—e.g. ethoxylation—of carboxy-, amino-, or hydroxy-terminated polymers; by coupling of polyalkylene oxides having a functional endgroup (such as —OH or —$NH_2$) with other polymers having a functional endgroup (such as —COOH) or for example with maleic acid anhydride polymer; or reaction of monomers with polyalkylene oxides with specific endgroups (i.e. polyalkylene oxide macroinitiator, polyalkylene oxide macromonomer or polyalkylene oxide macro-transfer agent). Suitable examples include poly(ethylene oxide)-block-poly(propylene oxide)-block-poly(polyethylene oxide) e.g. Pluronic PE grades commercially available from BASF; poly(propylene oxide)-block-polyethylene oxide-block-polypropylene oxide e.g. Pluronic RPE grades commercially available from BASF; poly(caprolactone)-block-poly(ethylene oxide); poly(methyl methacrylate-block-poly(ethylene oxide); poly(hydroxystearic acid)-block-poly(ethylene oxide)-block-poly(hydroxy stearic acid) e.g. Dehymuls LE commercially available from Cognis; graft copolymers based on methacrylate or acrylate terminated polyethylene oxide or graft copolymers prepared by reaction of amine terminated poly(alkylene oxides) (e.g. Jeffamines commercially available form Huntsman) with maleic anhydride copolymers.

Also suitable image dissolution inhibiting agents are alkoxylates of multifunctional alcohols such as butane diol and trimethylol propane, and alkyl esters of alkoxylated saccharides or polysaccharides such as polyoxyethylene sorbitan monolaurate and polyoxyethylene sorbitan monostearate.

(2) Polycondensation products of one or more alkylene group and/or one or more polyoxyalkylene group with an alkylene diamine, an alkylene triamine, an alkylene polyamine or an alkylene imine group. Preferred alkylenes are $C_2$-$C_4$ alkylenes, preferred polyoxyalkylenes include polyoxyethylene or polyoxypropylene, preferred alkylene diamines are ethylene diamine and propylene diamine, and a preferred alkylene triamine is diethylene triamine. Also of interest are polyethoxylated diamines, such as ETHODUOMEEN T/13, ETHODUOMEEN T/25 (tradenames of Lion Corporation).

(3) Cationic surfactants including primary, secundary, tertiary or quaternary ammonium salts, phosphonium salts or sulfonium salts. Examples of the quaternary ammonium salts include tetra-alkyl quaternary ammonium salts, modified trialkyl quaternary ammonium salts, trialkyl benzyl quaternary ammonium salts, modified trialkyl benzyl quaternary ammonium salts, alkyl pyridinium salts, modified alkyl pyridinium salts, alkyl quinolinium salts, imidazolinium salts and benzimidazolinium salts. Counter anions suitable for the above cationic compounds are for example chloride, bromide, iodide, a sulphonate, sulphate, carboxylate, phosphate or phosphonate anion. Suitable specific examples include triethyl benzyl ammonium chloride, tetramethyl ammonium chloride, triethyl benzyl ammonium bromide, trioctyl methyl ammonium chloride, tributyl benzyl ammonium chloride, trimethyl benzyl ammonium chloride, N-lauryl pyridinium chloride, tetra-n-butyl ammonium hydroxide, trimethyl benzyl ammonium hydroxide, tetramethyl ammonium bromide, tetraethyl ammonium bromide, tetra-n-butyl ammonium bromide. The surfactants disclosed in EP 1 182 512 in [0031] to [0043], are also suitable examples of cationic image dissolution inhibiting agents and are incorporated herein by reference.

(4) Polyamines represented by the following structure:

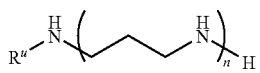

wherein n represents an integer equal to 2, 3 or 4;

and $R^u$ represents an optionally substituted alkyl group having upto 30 carbon atoms, or more preferably 2 to 25 carbon atoms.

Suitable examples thereof include dodecyldipropylenetriamine, cocodipropylenetriamine and tallowedipropylenetriamine.

(5) Ethoxylated amines and/or ethoxylated ammonium salts such as:

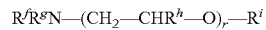

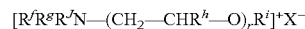

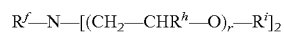

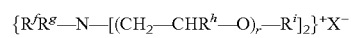

wherein $R^f$, $R^g$ and $R^j$ independently represent hydrogen, an alkyl group having up to 30 carbon atoms, or more preferably 2 to 20 carbon atoms, —$COR^s$, an optionally substituted aryl or aralkyl group;

$R^h$ represents hydrogen, methyl or ethyl and/or mixtures thereof;

$R^i$ represents hydrogen, an optionally substituted alkyl group having 1 to 30 C atoms, or more preferably 2 to 20 carbon atoms, —$COR^k$, —$CH_2COOH$ or —$CH_2COO^-$ $M^+$ with $M^+$=optionally substituted ammonium ion, $Na^+$ or $K^+$;

and wherein $R^k$ represents hydrogen, an optionally substituted alkyl group having 1 to 30 C atoms, or more preferably 2 to 20 carbon atoms, an optionally substituted aryl group or an optionally substituted aralkyl group;

$R^s$ represents an optionally substituted alkyl group having 1 to 30 C atoms, or more preferably 2 to 20 carbon atoms, an optionally substituted aryl group or an optionally substituted aralkyl group;

r represents an integer ranging between 2 to 30;

$X^-$ represents chloride, bromide, iodide, a sulphonate, sulphate, carboxylate, phosphate or phosphonate anion.

(6) Amphoteric surfactants represented by the following formula's:

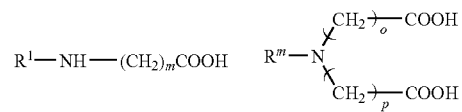

wherein:

$R^l$ and $R^m$ independently represents an optionally substituted alkyl group having 2 to 30 carbon atoms, or more preferably 4 to 20 carbon atoms;

m, o and p independently represent an integer ranging between 1 to 20.

Suitable examples thereof include betaine derivatives such as lauryl betaine, and glycine derivatives such as N-alkyl glycinate.

(7) Castor oil ethoxylates represented by the following structure:

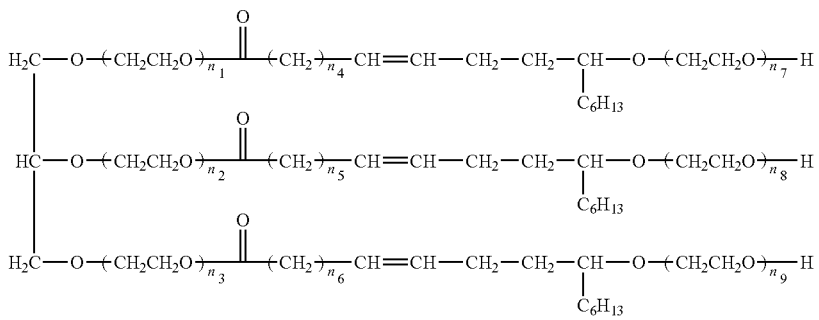

wherein $n_1$ to $n_3$ independently represents an integer ranging from 0 to 40 and $n_4$ to $n_9$ independently represents an integer ranging from 2 to 40.

(8) Surfactants comprising polymers including siloxane unit—e.g. a —Si(R,R')—O— group wherein R and R' are optionally substituted alkyl or aryl groups—and/or perfluoroalkyl units—e.g. a —(CF$_2$)— unit; or block- or graft- copolymers comprising a polyalkylene oxide block—e.g. —C$_n$H$_{2n}$—O— wherein n is preferably an integer in the range 2 to 5- and a block of polysiloxane and/or perfluoroalkyl units.

Specific examples of suitable image dissolution inhibiting agents include:

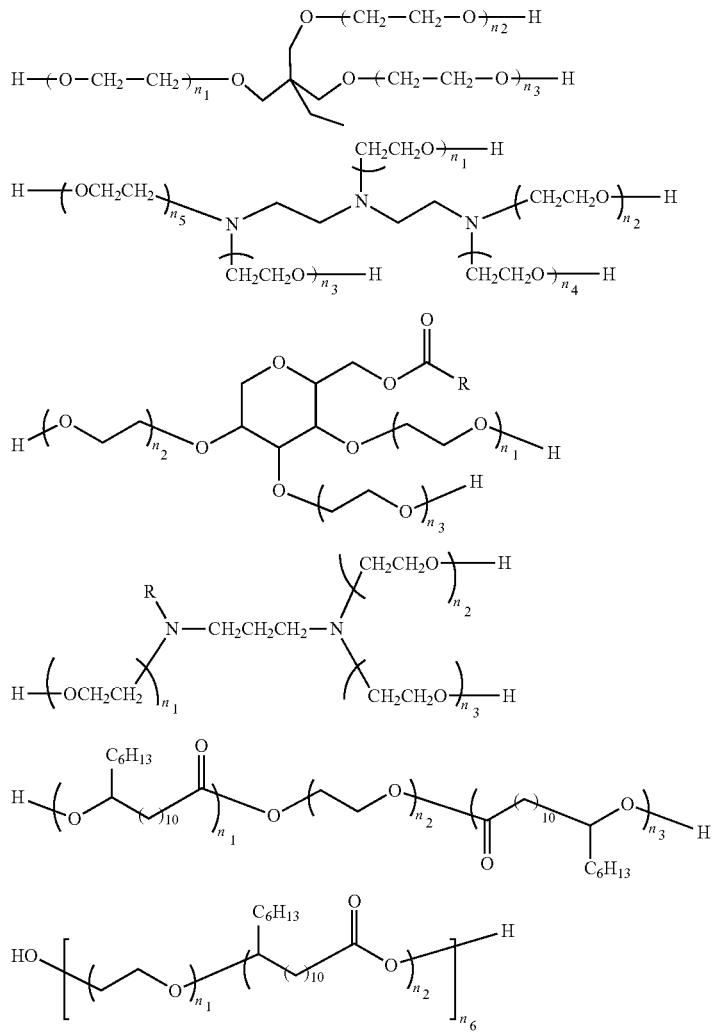

wherein independently in each of the structures above $n_1$ to $n_5$ independently represent an integer ranging between 2 and 40 and $n_6$ independently represents an integer ranging from 1 to 40.

The developer solution may contain other surfactants for improving its developing properties. Examples of suitable anionic surfactants include salts of higher alcohol (C8~C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and sodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate, sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

The developing solution further preferably contains a buffer such as for example a silicate-based buffer or a phosphate buffer. The concentration of the buffer in the developer preferably ranges between 3 to 14% wt. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution comprising sodium or potassium metasilicate, i.e. a silicate where the ratio of silicon dioxide to alkali metal oxide is 1.

The developing solution may optionally contain further components as known in the art: other buffer substances such as carbonate based buffers; chelating agents such as EDTA or NTA as disclosed in U.S. Pat. No. 4,469,776; complexes such as $[Co(NH_3)_6]Cl_3$ as disclosed in U.S. Pat. No. 4,606,995; inorganic salts such as sodium or kalium chloride or kalium bromide; inorganic alkaline agents such as sodium or lithium hydroxides, secundary or tertiary phosphates, sodium, potassium or ammonium carbonates, sodium or potassium bicarbonates, sodium, potassium or ammonium borates or citrates; organic alkaline agents such as alkyl amines, dialkyl amines or trialkyl amines, ethanolamines, ethylenediamine or pyridines; antifoaming agents; organic solvents—such as carboxylic acid esters i.e. alkyl acetates, alkyl ketones, ethylene glycol alkyl ethers, ethylene glycol aryl ethers, benzyl alcohol, xylene or methylene chloride—in small amounts i.e. preferably less than 10% wt and more preferably less than 5% wt; nonreducing sugars such as trehalose-type oligosaccharides i.e. sucrose or trehalose, glycosides i.e. alkyl glucosides or phenol glucosides, or sugar alcohols i.e. D,L-sorbitol or xylitol; corrosion inhibitors; dyes and/or hydrotropic agents. These components may be used alone or in combination.

According to the present invention there is provided a method for developing a heat-sensitive lithographic printing plate precursor comprising the step of immersing said precursor in the developing solution described above.

During the development the non-image areas of the coating are removed with the aqueous alkaline developer solution optionally in combination combined with mechanical rubbing, e.g. by a rotating brush. During the development step, any water-soluble layer present is preferably also removed.

The development step is preferably carried out at temperatures ranging between 20 and 40° C. in automated processing units as customary in the art.

To ensure a stable processing with the developer solution for a prolonged time, it is particularly important to control the concentration of the ingredients in the developer. Therefore a replenishing solution, hereinafter also referred to as replenisher, is often added to the developing solution. More than one replenishing solution containing different ingredients and/or different amounts of the ingredients may be added to the developing solution. Alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. It is advantageous that the (co)polymer of the present invention is present in the replenisher(s); preferably at a concentration of at least 0.5 g/l, more preferably in a concentration ranging between 1 and 50 g/l most preferably between 2 and 30 g/l.

The replenishing solution has preferably a pH value of at least 10, more preferably of at least 11, most preferably of at least 12.

The replenishing solution may be added continuously or in small amounts to the developing solution in order to regulate the concentration of the active ingredients in the developing solution at a constant level and/or at a level sufficiently high to ensure a stable development. The required amounts of regenerated material must be tailored to the developing apparatus used, the daily plate throughput, the composition of the image areas, etc. and are in general from 1 to 150 ml per square meter of plate precursor. The addition of replenisher can be regulated, for example, by measuring the conductivity of the developer as described in EP 556 690. Other means of supplementing a replenisher to the developer may be employed. Examples thereof include a method for intermittently or continuously supplementing a replenisher as a function of time and amount of plates processed as disclosed in GB 2 046 931; a method comprising disposing a sensor for detecting the degree of light-sensitive layer dissolved out in the middle portion of a developing zone and supplementing the replenisher in proportion to the detected degree of the light-sensitive layer dissolved out as disclosed in U.S. Pat. No. 4,537,496; a method comprising determining the impedance value of a developer and processing the detected impedance value by a computer to perform supplementation of a replenisher as disclosed in GB 2 208 249.

The lithographic printing plate precursor used in the present invention comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate of the current invention has preferably an Ra value below 0.45 µm, more preferably below 0.40 µm and most preferably below 0.30 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($q/m^2$ $Al_2O_3$ formed on the aluminium surface) varies between 1 and 8 $g/m^2$.

The anodic weight is preferably $\geq 3$ $g/m^2$, more preferably $\geq 3.5$ $g/m^2$ and most preferably $\geq 4.0$ $g/m^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from Ciba Speciality Chemicals.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The lithographic printing plate precursor used in the present invention comprises a heat and/or light-sensitive coating on a hydrophilic support. The imaging mechanism of the thermal printing plate precursors can be triggered by direct exposure to heat, e.g. by means of a thermal head, or by the light absorption of one or more compounds in the coating that are capable of converting light, more preferably infrared light, into heat.

In a preferred embodiment, the thermal printing plate precursor is positive working and relies on heat-induced solubilization of an oleophilic resin. The oleophilic resin present in the coating is preferably a polymer that is soluble in an aqueous developer, more preferably an aqueous alkaline developing solution with a pH between 7.5 and 14. Preferred polymers are phenolic resins e.g. novolac, resoles, polyvinyl phenols and carboxy substituted polymers. Typical examples of these polymers are described in DE-A-4007428, DE-A-4027301 and DE-A-4445820. The amount of phenolic resin present in the coating is preferably at least 50% by weight, preferably at least 80% by weight relative to the total weight of all the components present in the coating.

The oleophilic resin is preferably a phenolic resin wherein the phenyl group or the hydroxy group is chemically modified with an organic substituent. The phenolic resins which are chemically modified with an organic substituent may exhibit an increased chemical resistance against printing chemicals such as fountain solutions or plate treating liquids such as plate cleaners. Examples of such chemically modified phenolic resins are described in EP-A 0 934 822, EP-A 1 072 432, U.S. Pat. No. 5,641,608, EP-A 0 982 123, WO 99/01795, EP-A 02 102 446, EP-A 02 102 444, EP-A 02 102 445, EP-A 02 102 443, EP-A 03 102 522. The modified resins described in EP-A 02 102 446, are preferred, especially those resins wherein the phenyl-group of said phenolic resin is substituted with a group having the structure —N═N-Q, wherein the —N═N— group is covalently bound to a carbon atom of the phenyl group and wherein Q is an aromatic group.

The coating may comprise a second layer that comprises a polymer or copolymer (i.e. (co)polymer) comprising at least one monomeric unit that comprises at least one sulfonamide group. This layer is located between the layer described above comprising the oleophilic resin and the hydrophilic support. Hereinafter, 'a (co)polymer comprising at least one monomeric unit that comprises at least one sulfonamide group' is also referred to as "a sulphonamide (co)polymer". The sulphonamide (co)polymer is preferably alkali soluble. The sulphonamide group is preferably represented by —NR—$SO_2$—, —$SO_2$—NR— or —$SO_2$—NRR' wherein R and R' each independently represent hydrogen or an organic substituent.

Sulfonamide (co)polymers are preferably high molecular weight compounds prepared by homopolymerization of monomeric units containing at least one sulfonamide group or by copolymerization of such monomeric units and other polymerizable monomeric units.

Examples of monomeric units containing at least one sulfonamide group include monomeric units further containing at least one polymerizable unsaturated bond such as an acryloyl, allyl or vinyloxy group. Suitable examples are disclosed in U.S. Pat. No. 5,141,838, EP 1545878, EP 909,657, EP 0 894 622 and EP 1,120,246.

Examples of monomeric units copolymerized with the monomeric units containing at least one sulfonamide group include monomeric units as disclosed in EP 1,262,318, EP 1,275,498, EP 909,657, EP 1,120,246, EP 0 894 622 and EP 1,400,351.

Suitable examples of sulfonamide (co)polymers and/or their method of preparation are disclosed in EP-A 933 682, EP-A 982 123, EP-A 1 072 432, WO 99/63407 and EP 1,400, 351.

A highly preferred example of a sulfonamide (co)polymer is a homopolymer or copolymer comprising a structural unit represented by the following general formula (VXI):

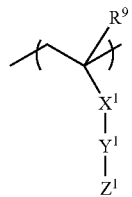

(XVI)

wherein:
R⁹ represents hydrogen or a hydrocarbon group having up to 12 carbon atoms; preferably R⁹ represents hydrogen or a methyl group;
X¹ represents a single bond or a divalent linking group. The divalent linking group may have up to 20 carbon atoms and may contain at least one atom selected from C, H, N, O and S. Preferred divalent linking groups are a linear alkylene group having 1 to 18 carbon atoms, a linear, branched, or cyclic group having 3 to 18 carbon atoms, an alkynylene group having 2 to 18 carbon atoms and an arylene group having 6 to 20 atoms, —O—, —S—, —CO—, —CO—O—, —O—CO—, —CS—, —NR″R°—, —CO—NR″—, —NR″—CO—, —NR″—CO—O—, —O—CO—NR″—, —NR″—CO—NR°—, —NR″—CS—NR°—, a phenylene group, a naphtalene group, an anthracene group, a heterocyclic group, or combinations thereof, wherein R″ and R° each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group. Preferably X¹ is a methylene group, an ethylene group, a propylene group, a butylene group, an isopropylene group, cyclohexylene group, a phenylene group, a tolylene group or a biphenylene group;
Y¹ is a bivalent sulphonamide group represented by —NR^p—SO₂— or —SO₂—NR^q— wherein R^p and R^q each independently represent hydrogen, an optionally substituted alkyl, alkanoyl, alkenyl, alkynyl, cycloalkyl, heterocyclic, aryl, heteroaryl, aralkyl or heteroaralkyl group or a group of the formula —C(=N)—NH—R¹⁰, wherein R¹⁰ represents hydrogen or an optionally substituted alkyl or aryl group;
Z¹ represents a terminal group preferably represented by hydrogen or an optionally substituted linear, branched, or cyclic alkylene or alkyl group having 1 to 18 carbon atoms such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, an optionally substituted arylene or aryl group having 6 to 20 carbon atoms; an optionally substituted hetero-arylene or heteroaryl group; a linear, branched, or cyclic alkenylene or alkenyl group having 2 to 18 carbon atoms, a linear, branched, or cyclic alkynylene or alkynyl group having 2 to 18 carbon atoms or an alkoxy group.
Examples of preferred substituents optionally present on the groups representing Z¹ are an alkyl group having up to 12 carbon atoms, an alkoxy group having up to 12 carbon atoms, a halogen atom or a hydroxyl group.

The structural unit represented by the general formula (XVI) has preferably the following groups:
X¹ represents an alkylene, cyclohexylene, phenylene or tolylene group, —O—, —S—, —CO—, —CO—O—, —O—CO—, —CS—, —NR″R°—, —CO—NR″—, —NR″—CO—, —NRn-CO—O—, —O—CO—NR″—, —NR″—CO—NR°—, —NR″—CS—NR°—, or combinations thereof, and wherein R″ and R° each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group;
Y¹ is a bivalent sulphonamide group represented by —NR^p—SO₂—, —SO₂—NR^q— wherein R^p and R^q each independently represent hydrogen, an optionally substituted alkyl, alkanoyl, alkenyl, alkynyl, cycloalkyl, heterocyclic, aryl, heteroaryl, aralkyl or heteroaralkyl group;
Z¹ is a terminal group represented by hydrogen, an alkyl group such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group or an octyl group, a benzyl group, an optionally substituted aryl or heteroaryl group, a naphtyl group, an anthracenyl group, a pyridyl group, an allyl group or a vinyl group.

Specific preferred examples of sulphonamide (co)polymers are polymers comprising N-(p-aminosulfonylphenyl)(meth)acrylamide, N-(m-aminosulfonylphenyl)(meth)acrylamide and/or N-(o-aminosulfonylphenyl)(meth)acrylamide. A particularly preferred sulphonamide (co)polymer is a polymer comprising N-(p-aminosulphonylphenyl)methacrylamide wherein the sulphonamide group comprises an optionally substituted straight, branched, cyclic or heterocyclic alkyl group, an optionally substituted aryl group or an optionally substituted heteroaryl group.

The layer comprising the sulphonamide (co)polymer may further comprise additional hydrophobic binders such as a phenolic resin (e.g. novolac, resoles or polyvinyl phenols), a chemically modified phenolic resin or a polymer containing a carboxyl group, a nitrile group or a maleimide group.

The dissolution behavior of the coating can be fine-tuned by optional solubility regulating components. More particularly, development accelerators and development inhibitors can be used. In the embodiment where the coating comprises more than one layer, these ingredients can be added to the first layer, to the second layer and/or to an optional other layer of the coating.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins comprising at least 70 mol % meta-cresol as recurring monomeric units are also suitable development accelerators.

In a preferred embodiment, the coating also contains developer resistance means, also called development is inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP-A 823 327 and WO97/39894 are believed to act as dissolution inhibitors due to interaction, e.g. by hydrogen bridge formation, with the alkali-soluble resin(s) in the coating. Inhibitors of this type typically comprise at least one hydrogen bridge forming group such as nitrogen atoms, onium groups, carbonyl (—CO—), sulfinyl (—SO—) or sulfonyl (—SO$_2$—) groups and a large hydrophobic moiety such as one or more aromatic rings. Some of the compounds mentioned below, e.g. infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the first layer and/or, if present, in the second layer as described in e.g. EP-A 950 518, and/or in a development barrier layer on top of said layer, as described in e.g. EP-A 864 420, EP-A 950 517, WO 99/21725 and WO 01/45958. In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:
(a) A polymeric material which is insoluble in or impenetrable by the developer, e.g. a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers comprising siloxane (silicones) and/or perfluoroalkyl units.
(b) Bifunctional compounds such as surfactants comprising a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 mg/m$^2$, more preferably between 50 and 90 mg/m$^2$.
(c) Bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 mg/m$^2$, preferably between 0.5 and 15 mg/m$^2$ and most preferably between 0.5 and 10 mg/m$^2$. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Said poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the first and/or of the optional second layer. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the first, optional second and/or other layers of the coating. In that embodiment, it may be advantageous to use a solvent in the separate solution that is not capable of dissolving the ingredients present in the other layers so that a highly concentrated water-repellent or hydrophobic phase is obtained at the top of the coating which is capable of acting as the above mentioned development barrier layer.

In addition, the first or optional second layer and/or other layer may comprise polymers that further improve the run length and/or the chemical resistance of the plate. Examples thereof are polymers comprising imido (—CO—NR—CO—) pendant groups, wherein R is hydrogen, optionally substituted alkyl or optionally substituted aryl, such as the polymers described in EP-A 894 622, EP-A 901 902, EP-A 933 682 and WO 99/63407.

The coating of the heat-sensitive printing plate precursor preferably also contains an infrared light absorbing dye or pigment which, in the embodiment where the coating comprises more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

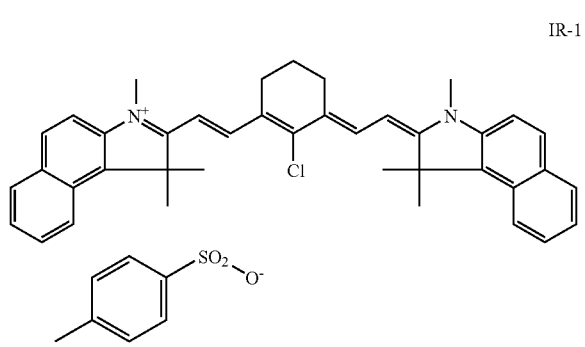

IR-1

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes. Dyes which, combined with specific additives, only slightly color the coating but which become intensively colored after exposure, as described in for example WO2006/005688 may also be used as colorants.

To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 µm, preferably from 0.1 to 3.0 µm, particularly preferably from 0.15 to 1.0 µm.

Optionally, the coating may further contain additional ingredients such as surfactants, especially perfluoro surfactants, silicon or titanium dioxide particles or polymers particles such as matting agents and spacers.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 µm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized is by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

After exposure, the precursor is developed by means of the development solution used in the present invention. The exposed printing plate precursor is immersed in the developing solution; this may be combined with mechanical rubbing, e.g. by using a rotating brush. During development, any watersoluble protective layer present is also removed.

More details concerning the development step can be found in for example EP 1614538, EP 1614539, EP 1614540 and WO/2004071767.

The heat and/or light sensitive printing plates can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

The developing solution used in the present invention can also be used for treating thermo-resists, for example on a PCB (printed circuit board) application as described in US 2003/0003406 A1.

EXAMPLES

Example 1

1. Preparation of the Developer Solutions

To 1 liter of the plate developer solution DEV-01 (Table 1) three gram of a compound given in Table 2 was added and subsequently stirred for 2 hours resulting in the developer solutions DEV-2 to DEV-6. From the obtained developer solutions DEV 1 to DEV 6 the conductivity, pH and density were measured at room temperature and are given in Table 2.

TABLE 1 composition of the developer solution DEV-01.

| INGREDIENTS | DEV-01 |
| --- | --- |
| De-ionized water | 750 ml |
| Dissolvine GH-X (1) | 5 g |
| Metso 510 (2) | 112.5 g |
| Na-Silicate 340-3740 solution (3) | 14.7 ml |
| Synperonic T-304 (4) | 0.094 g |
| Pluriol P600 (5) | 0.380 g |
| 50% wt. NaOH solution | 1.6 ml |
| Triton H-66 (6) | 2.78 g |
| Total | 1000 ml |

(1) Na-glucoheptanoate dihydrate, commercially available from Akzo Nobel, The Netherlands;
(2) Sodium metasilicate pentahydrate, commercially available from Ineos Silicas, The Netherlands;
(3) 35.5% wt sodium silicate solution commercially available from Silmaco NV, Belgium;
(4) block-co-polymer of polyethylene oxide (PEO) and polypropylene oxide (PPO) attached to ethylenediamine (=EDA) in a ratio EDA/PEO/PPO of 1/15/14 and having a mean molecular weight of 1600, commercially available from UNIQEMA;
(5) polypropylene oxide, commercially available from BASF, Germany;
(6) anionic surfactant commercially available from SEPULCHRE.

TABLE 2

DEV-01 to DEV-06.

| Developer | Compound added | conductivity ms/cm | pH | Density g/ml |
| --- | --- | --- | --- | --- |
| DEV-01 reference | — | 79.9 | 13.20 | 1.078 |
| DEV-02 inventive | Lyncur M S-4 (1) | 76.8 | 13.17 | 1.074 |
| DEV-03 inventive | Lyncur CMM (2) | 77.9 | 13.21 | 1.074 |
| DEV-04 inventive | Lyncur CHM (3) | 78.0 | 13.23 | 1.074 |
| DEV-05 inventive | Lyncur CST 70 (4) | 77.5 | 13.23 | 1.074 |
| DEV-06 comparative | PAPS-PN1 (5) | 77.1 | 13.16 | 1.075 |

(1) Lyncur M S-4 is a polyhydroxystryrene with a Mw of 7,000-11,000 and a Mn of 3300-5200 commercially available from Maruzen Petrochemical Co., Ltd. (Tokyo, Japan) comprising the following monomeric unit:

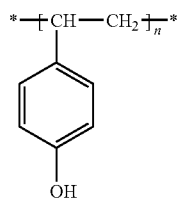

(2) Lyncur CMM is a copolymer of hydroxystyrene and methylmethacrylate with a Mw of 8,000-12,000 and a Mn of 3000-5000 commercially available from Maruzen Petrochemical Co., Ltd. (Tokyo, Japan) comprising the following monomeric units:

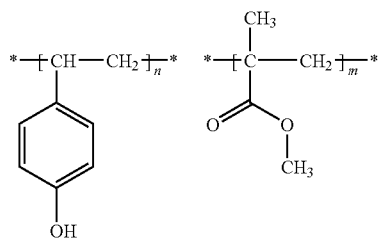

with n/m=1

(3) Lyncur CHM is a copolymer of hydroxystyrene and HEMA with a Mw of 10,000-30,000 and a Mn of 3000-5000 from Maruzen Petrochemical Co., Ltd. (Tokyo, Japan) comprising the following monomeric units:

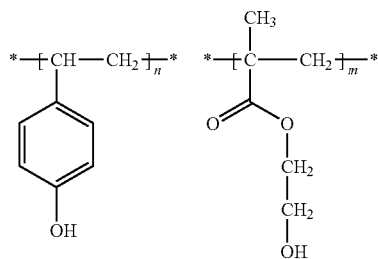

with n/m=1

(4) Lyncur CST 70 is a copolymer of hydroxystyrene and styrene with a Mw of 2500-4000 and a Mn of 1500-2400 from Maruzen Petrochemical Co., Ltd. (Tokyo, Japan) comprising the following monomeric units:

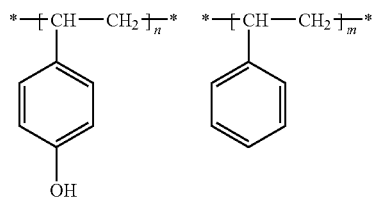

with n/m=70/30

(5) PAPS-PN1 is a phenol (Novolak) with a Mw of 412 and a Mn of 340 (sharp molecular weight distribution) from Asahi Organic Chemicals Industry Co., Ltd. (Tokyo, Japan).

2. Evaluation of the Developing Solutions

Subsequently, a small oscillating scale was filled with 1 liter of each of the developing solutions DEV-01 to DEV-06. In this oscillating scale Agfa Thermostar P970 plates, commercially available from Agfa Graphics, which were exposed on a Creo TrendSetter 3244 equipped with a 20 W head (150 mJ/cm$^2$), were processed up to a developer exhaustion level of 4 m$^2$ exposed plate/liter at a processing temperature of 25° C. and a dip time of 22 s.

The conductivity C (mS/cm) of the developing solution as well as the sensitivity of the plate (RE) were evaluated at a developer exhaustion level of respectively 1, 2 and 4 m$^2$ exposed plate/liter (see Tables 3 and 4).

RE is defined as the exposure energy density value (mJ/cm$^2$) where the 1×1 and 8×8 checkerboard patterns on the plate after processing have the same density (measured with a Gretag Macbeth D19C densitometer, available from Gretag Macbeth AG and calibrated using a blank part of the substrate cleaned with acetone).

TABLE 3

Conductivity values during processing.

| | Conductivity (C) mS/cm | | | | |
|---|---|---|---|---|---|
| Developer | after 0 m$^2$/l | after 1 m$^2$/l | after 2 m$^2$/l | after 4 m$^2$/l | ΔC |
| DEV-01 Reference | 79.9 | 78.6 | 76.9 | 74.0 | 5.9 |
| DEV-02 Inventive | 76.8 | 75.4 | 74.0 | 71.4 | 5.4 |
| DEV-03 Inventive | 77.9 | 76.6 | 75.2 | 72.4 | 5.4 |
| DEV-04 Inventive | 78.0 | 76.6 | 75.3 | 72.3 | 5.7 |
| DEV-05 Inventive | 77.5 | 76.2 | 74.9 | 71.7 | 5.8 |
| DEV-06 Comparative | 77.1 | 76.3 | 75.2 | 72.1 | 5.0 |

The results in Tables 3 show that the conductivity and the conductivity decrease AC of the Reference, Comparative and Inventive examples are similar. On the basis of the conductivity test, the developers cannot be distinguished from each other.

TABLE 4

RE values during processing.

| | | Right Exposure (RE) mJ/cm$^2$ | | | | |
|---|---|---|---|---|---|---|
| Example | Developer | After 0 m$^2$/l | after 1 m$^2$/l | after 2 m$^2$/l | after 4 m$^2$/l | ΔRE |
| 1 | DEV-01 Ref. | 185 | 175 | 167 | 150 | 35 |
| 2 | DEV-02 Inv. | 188 | 187 | 178 | 173 | 15 |
| 3 | DEV-03 Inv. | 197 | 197 | 190 | 171 | 26 |
| 4 | DEV-04 Inv. | 185 | 181 | 176 | 162 | 23 |
| 5 | DEV-05 Inv. | 200 | 194 | 185 | 174 | 26 |
| 6 | DEV-06 Comp. | 160 | 150 | 141 | 128 | 32 |

The results in Table 4 show that:
the developer solutions DEV-01 (Reference Example 1) and DEV-06 (Comparative Example 6) show a higher decrease of the RE value at the beginning of the processing test up to 1 ml/m$^2$ compared to the Inventive Examples 2 to 5;
the decrease of the RE values measured at a developer exhaustion level of 4 m$^2$/l (ΔRE) of the Comparative Example and Reference Example is significantly higher compared to ΔRE of the Inventive Examples;
ΔRE of Reference Example 1 is similar to ΔRE of Comparative Example 6.

These results show that the addition of the (co)polymer comprising a hydroxyaryl group according to the invention prevents a substantial acceleration of the development at the start of the developing test (0 to 1 m$^2$/l). Furthermore, the development remains stable during the test as indicated by the lower LRE values obtained after 4 m$^2$/l of development.

The invention claimed is:

1. A method for developing a heat-sensitive lithographic printing plate precursor comprising the step of immersing said precursor in an aqueous alkaline developing solution comprising a (co)polymer comprising (i) a monomeric unit which is represented by the following formula I:

(I)

wherein L is a linking group; $R^1$, $R^2$ and $R^3$ independently represent hydrogen or an alkyl group; $R^4$ represents an optionally substituted hydroxyaryl group; x=0 or 1; and y=0 or 1 and when y=0 then x=1 and L is further bound to C* to form a cyclic structure, and (ii) one or more monomeric units derived from the monomers selected from the group consisting of styrene, acrylic acid, methacrylic acid, alkylacrylate, alkyl methacrylate, allyl methacrylate, hydroxyalkykl methacrylate, and hydroxyalkyl acrylate.

2. The method according to claim 1, wherein the hydroxyaryl group is an optionally substituted phenolic group.

3. The method according to claim 1, wherein the (co)polymer is a copolymer of hydroxystyrene and styrene, hydroxystyrene and alkyl(meth)acrylate or hydroxystyrene and hydroxyalkyl(meth)acrylate.

4. The method according to claim 1, wherein the (co)polymer is present in the developing solution in an amount ranging between 0.05% wt to 5% wt.

5. The method according to claim 1, the developing solution further comprising an image dissolution inhibiting agent.

6. The method according to claim 1, wherein the developing solution has a pH above 11.

7. The method according to claim 1, wherein the printing plate precursor comprises a coating including an oleophilic resin.

8. The method according to claim 5, wherein the image dissolution inhibiting agent is:
a. polyglycols with the following structure:

wherein n is greater than 1;

$R^d$ represents hydrogen, an optionally substituted alkyl group having 1 to 30 carbon atoms, —COR$^t$ or an optionally substituted aryl or aralkyl group;

$R^b$ represents hydrogen, methyl, ethyl and/or mixtures thereof;

$R^c$ represents hydrogen, an alkyl group, —COR$^d$, —NR$^d$R$^e$, —CH$_2$COOH or —CH$_2$COO-M$^+$;

and wherein M$^+$ represents NH$_4^+$, Na$^+$ or K$^+$ and R$^d$, R$^e$ and R$^t$ independently represent hydrogen, an optionally substituted alkyl group having 1 to 30 carbon atoms, an optionally substituted aryl group or aralkyl group;

b. polycondensation products of one or more alkylene group and/or one or more polyoxyalkylene group with an alkylene diamine, an alkylene triamine, an alkylene polyamine or an alkylene imine group; or c. cationic surfactants including primary, secondary, tertiary or quaternary ammonium salts, phosphonium salts or sulfonium salts.

9. The method according to claim 7, wherein the coating comprises at least two layers: a layer comprising the oleophilic resin; and another layer comprising a sulfonamide binder which is located between the support and said layer comprising the oleophilic resin.

10. The method according to claim 2, wherein the (co)polymer is a copolymer of hydroxystyrene and styrene, hydroxystyrene and alkyl(meth)acrylate or hydroxystyrene and hydroxyalkyl(meth)acrylate.

11. The method according to claim 3, wherein the (co)polymer is present in the developing solution in an amount ranging between 0.05% wt to 5% wt.

12. The method according to claim 3, the developing solution further comprising an image dissolution inhibiting agent.

13. The method according to claim 3, wherein the developing solution has a pH above 11.

14. The method according to claim 10, wherein the (co)polymer is present in the developing solution in an amount ranging between 0.05% wt to 5% wt.

15. The method according to claim 12, wherein the (co)polymer is present in the developing solution in an amount ranging between 0.05% wt to 5% wt.

16. The method according to claim 2, the developing solution further comprising an image dissolution inhibiting agent.

17. The method according to claim 2, wherein the developing solution has a pH above 11.

18. The method according to claim 7, the developing solution further comprising an image dissolution inhibiting agent.

19. The method according to claim 7, wherein the developing solution has a pH above 11.

20. The method according to claim 9, wherein the (co)polymer is present in the developing solution in an amount ranging between 0.05% wt to 5% wt.

21. The method according to claim 9, further comprising an image dissolution inhibiting agent.

22. The method according to claim 9, wherein the developing solution has a pH above 11.

23. The method according to claim 21, wherein the image dissolution inhibiting agent is:

a. polyglycols with the following structure:

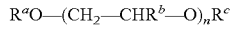

wherein n is greater than 1;

$R^a$ represents hydrogen, an optionally substituted alkyl group having 1 to 30 carbon atoms, —COR$^t$ or an optionally substituted aryl or aralkyl group;

$R^b$ represents hydrogen, methyl, ethyl and/or mixtures thereof;

$R^c$ represents hydrogen, an alkyl group, —COR$^d$, NR$^d$R$^e$, —CH$_2$COOH or —CH$_2$COO-M;

and wherein M$^+$ represents NH$_4$, Na$^+$ or K$^+$ and R$^d$, R$^e$ and R$^t$ independently represent hydrogen, an optionally substituted alkyl group having 1 to 30 carbon atoms, an optionally substituted aryl group or aralkyl group;

b. polycondensation products of one or more alkylene group and/or one or more polyoxyalkylene group with an alkylene diamine, an alkylene triamine, an alkylene polyamine or an alkylene imine group; or c. cationic surfactants including primary, secondary, tertiary or quaternary ammonium salts, phosphonium salts or sulfonium salts.

24. The method according to claim 8, wherein the image dissolution inhibiting agent is a polyglycol with the following structure:

wherein n is greater than 1;

$R^a$ represents hydrogen, an optionally substituted alkyl group having 1 to 30 carbon atoms, —COR$^t$ or an optionally substituted aryl or aralkyl group;

$R^b$ represents hydrogen, methyl, ethyl and/or mixtures thereof;

$R^c$ represents hydrogen, an alkyl group, —COR$^d$, —NR$^d$R$^e$, —CH$_2$COOH or —CH$_2$COO-M$^+$;

and wherein M$^+$ represents NH$_4^+$, Na$^+$ or K$^+$ and R$^d$, R$^e$ and R$^t$ independently represent hydrogen, an optionally substituted alkyl group having 1 to 30 carbon atoms, an optionally substituted aryl group or aralkyl group.

25. The method according to claim 24, wherein the polyglycol is selected from the group consisting of polyethylene glycol, polypropylene glycol, poly(ethylene oxide)-block-poly(propylene oxide)-block-poly(polyethylene oxide), poly(propylene oxide)-block-polyethylene oxide-block-polypropylene oxide; poly(caprolactone)-block-poly(ethylene oxide), poly(methyl methacrylate-block-poly(ethylene oxide), poly(hydroxystearic acid)-block-poly(ethylene oxide)-block-poly(hydroxy stearic acid), graft copolymers based on methacrylate or acrylate terminated polyethylene oxide, and graft copolymers prepared by reaction of amine terminated poly(alkylene oxides).

26. The method according to claim 23, wherein the image dissolution inhibiting agent is a polyglycol with the following structure:

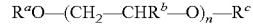

wherein n is greater than 1;

$R^a$ represents hydrogen, an optionally substituted alkyl group having 1 to 30 carbon atoms, —COR$^t$ or an optionally substituted aryl or aralkyl group;

$R^b$ represents hydrogen, methyl, ethyl and/or mixtures thereof;

$R^c$ represents hydrogen, an alkyl group, —COR$^d$, —NR$^d$R$^e$, —CH$_2$COOH or —CH$_2$COO$^-$M$^+$;

and wherein M$^+$ represents NH$_4^+$, Na$^+$ or K$^+$ and R$^d$, R$^e$ and R$^t$ independently represent hydrogen, an optionally substituted alkyl group having 1 to 30 carbon atoms, an optionally substituted aryl group or aralkyl group.

27. The method according to claim 26, wherein the polyglycol is selected from the group consisting of polyethylene glycol, polypropylene glycol, poly(ethylene oxide)-block-poly(propylene oxide)-block-poly(polyethylene oxide), poly (propylene oxide)-block-polyethylene oxide-block-polypropylene oxide; poly(caprolactone)-block-poly(ethylene oxide), poly(methyl methacrylate-block-poly(ethylene oxide), poly(hydroxystearic acid)-block-poly(ethylene oxide)-block-poly(hydroxy stearic acid), graft copolymers based on methacrylate or acrylate terminated polyethylene oxide, and graft copolymers prepared by reaction of amine terminated poly(alkylene oxides).

* * * * *